United States Patent
Cheng et al.

(10) Patent No.: US 11,004,944 B2
(45) Date of Patent: *May 11, 2021

(54) GATE CUT DEVICE FABRICATION WITH EXTENDED HEIGHT GATES

(71) Applicant: INTERNATIONAL BUSINESS MACHINES CORPORATION, Armonk, NY (US)

(72) Inventors: Kangguo Cheng, Schenectady, NY (US); Andrew M. Greene, Albany, NY (US); John R. Sporre, Albany, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/682,361

(22) Filed: Nov. 13, 2019

(65) Prior Publication Data

US 2020/0083334 A1 Mar. 12, 2020

Related U.S. Application Data

(63) Continuation of application No. 16/003,759, filed on Jul. 12, 2018, now Pat. No. 10,541,308, which is a (Continued)

(51) Int. Cl.
*H01L 29/40* (2006.01)
*H01L 29/66* (2006.01)
(Continued)

(52) U.S. Cl.
CPC .... *H01L 29/401* (2013.01); *H01L 21/823431* (2013.01); *H01L 29/0649* (2013.01);
(Continued)

(58) Field of Classification Search
CPC ............... H01L 29/401; H01L 29/785; H01L 29/66795; H01L 29/66439; H01L 29/66545; H01L 21/823431
See application file for complete search history.

(56) References Cited

U.S. PATENT DOCUMENTS 6,403,486 B1   6/2002  Lou
6,788,561 B2   9/2004  Watanabe et al.
(Continued)

OTHER PUBLICATIONS

List of IBM Patents or Patent Applications Treated as Related dated Nov. 13, 2019, 2 pages.
(Continued)

*Primary Examiner* — Joseph C. Nicely
(74) *Attorney, Agent, or Firm* — Tutunjian & Bitetto, P.C.; Randall Bluestone

(57) ABSTRACT

Methods of forming semiconductor devices include forming a lower dielectric layer, to a height below a height of a dummy gate hardmask disposed across multiple device regions, by forming a dielectric fill to the height of a dummy gate and etching the dielectric fill back. A dummy gate structure includes the dummy gate and the dummy gate hardmask. A protective layer is formed on the dielectric layer to the height of the dummy gate hardmask. The dummy gate hardmask is etched back to expose the dummy gate.

16 Claims, 8 Drawing Sheets

Related U.S. Application Data continuation of application No. 15/397,122, filed on Jan. 3, 2017, now Pat. No. 10,079,287.

(51) Int. Cl.
　　*H01L 29/06*　　　(2006.01)
　　*H01L 29/423*　　(2006.01)
　　*H01L 21/8234*　(2006.01)
　　*H01L 29/78*　　　(2006.01)
　　*H01L 29/775*　　(2006.01)

(52) U.S. Cl.
　　CPC .... *H01L 29/4232* (2013.01); *H01L 29/66439* (2013.01); *H01L 29/66545* (2013.01); *H01L 29/66795* (2013.01); *H01L 29/66871* (2013.01); *H01L 29/785* (2013.01); *H01L 29/0673* (2013.01); *H01L 29/775* (2013.01)

(56) References Cited

U.S. PATENT DOCUMENTS

| | | | |
|---|---|---|---|
| 8,846,491 B1 | 9/2014 | Pham et al. | |
| 9,064,932 B1 | 6/2015 | Pham et al. | |
| 9,236,437 B2 | 1/2016 | Zaleski et al. | |
| 9,252,021 B2 | 2/2016 | Ng et al. | |
| 9,263,442 B2 | 2/2016 | Anderson et al. | |
| 10,079,287 B2 * | 9/2018 | Cheng | H01L 29/0649 |
| 10,541,308 B2 * | 1/2020 | Cheng | H01L 29/4232 |
| 2004/0067649 A1 | 4/2004 | Hellring et al. | |
| 2015/0076609 A1 | 3/2015 | Xie et al. | |
| 2015/0255458 A1 | 9/2015 | Ando et al. | |
| 2015/0279971 A1 | 10/2015 | Xie et al. | |
| 2015/0325482 A1 | 11/2015 | Hu et al. | |
| 2015/0340461 A1 | 11/2015 | Wei et al. | |
| 2016/0020205 A1 * | 1/2016 | Song | H01L 29/41775 257/379 |
| 2016/0043223 A1 | 2/2016 | Xie et al. | |
| 2016/0056181 A1 | 2/2016 | Anderson et al. | |

OTHER PUBLICATIONS

Non Final Rejection for U.S. Appl. No. 16/033,786 dated May 15, 2019 (24 pages).

* cited by examiner

GATE CUT DEVICE FABRICATION WITH EXTENDED HEIGHT GATES

BACKGROUND

Technical Field

The present invention generally relates to semiconductor device fabrication and, more particularly, to fabrication of semiconductor devices using a gate cut process.

Description of the Related Art

Gate cut processes in the fabrication of semiconductor devices such as, e.g., field effect transistors (FETs) form multiple devices in a single process by forming a single dummy gate, cutting the dummy gate into multiple sections, and subsequently replacing the sections with respective final gates. To accomplish this, existing gate cut processes deposit a layer of oxide material around the dummy gates to define the gate region while the gate cut is performed.

However, the etching processes that are used to perform the gate cut are generally poorly selective between the surrounding oxide material and the nitride material that is often used as a dummy gate hardmask. As a result, when the dummy gate hardmask is etched away, some of the surrounding oxide material is removed as well, creating a recess in this layer. Because the surrounding oxide material is used to define the height of the replacement gate structure, this also results in a decrease in the height of the replacement gate. Additionally, gate material from the formation of the replacement gate may accumulate in the recesses of the surrounding oxide material.

SUMMARY

A method of forming semiconductor devices includes forming a lower dielectric layer, to a height below a height of a dummy gate hardmask disposed across multiple device regions, by forming a dielectric fill to the height of a dummy gate and etching the dielectric fill back. A dummy gate structure includes the dummy gate and the dummy gate hardmask. A protective layer is formed on the dielectric layer to the height of the dummy gate hardmask. The dummy gate hardmask is etched back to expose the dummy gate.

A method of forming semiconductor devices includes forming a lower dielectric layer, to a height below a height of a dummy gate hardmask disposed across multiple device regions. A dummy gate structure includes a dummy gate and the dummy gate hardmask. A protective layer is formed on the dielectric layer to the height of the dummy gate hardmask. The dummy gate hardmask is etched back to expose the dummy gate. The protective layer is converted to an upper dielectric layer.

A method of forming semiconductor devices includes forming a lower dielectric layer, to a height below a height of a dummy gate hardmask disposed across multiple device regions. A dummy gate structure includes a dummy gate and the dummy gate hardmask. A protective layer is formed on the dielectric layer to the height of the dummy gate hardmask. The dummy gate hardmask is etched back to expose the dummy gate. The dummy gate is removed in one or more barrier regions. A dielectric barrier is formed in the one or more barrier regions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use a layer of etch stop material on top of a layer of oxide material to prevent damage to the layer of oxide material during a gate cut process. This etch stop material may later be replaced or oxidized to form an appropriate dielectric material between device components.

Figure 1:
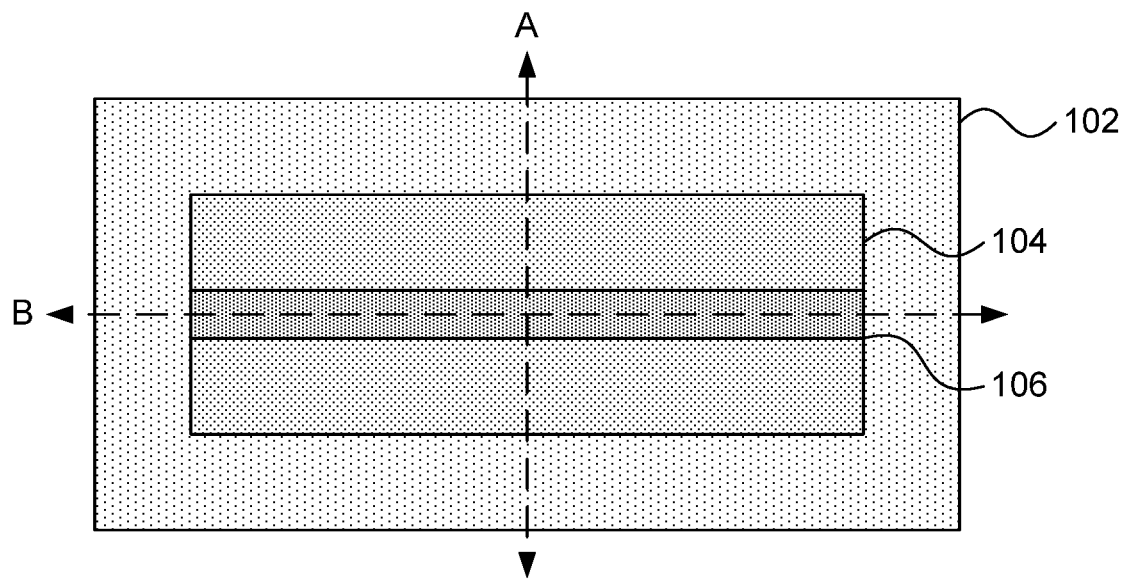
FIG. 1 is a top-down view of a step in the formation of semiconductor devices in accordance with the present principles.

Referring now to FIG. 1, a top-down view of a step in the formation of a semiconductor device is shown. A semiconductor substrate 102 is shown, with a dummy gate structure 106 and source/drain regions 104 shown on the semiconductor substrate. Additionally, cuts A and B are shown. Cuts A and B will form the basis for subsequent descriptions of the structures herein, with cross-sectional diagrams along each cut being provided.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

It should furthermore be understood that, although the present embodiments are depicted specifically in the context of planar-channel devices, with a transistor channel being formed in the surface of the substrate 102, alternative embodiments may employ any appropriate variety of channel structure including, without limitation, fin channel structures, nanowire channel structures, nanosheet channel structures, etc.

Figure 2:
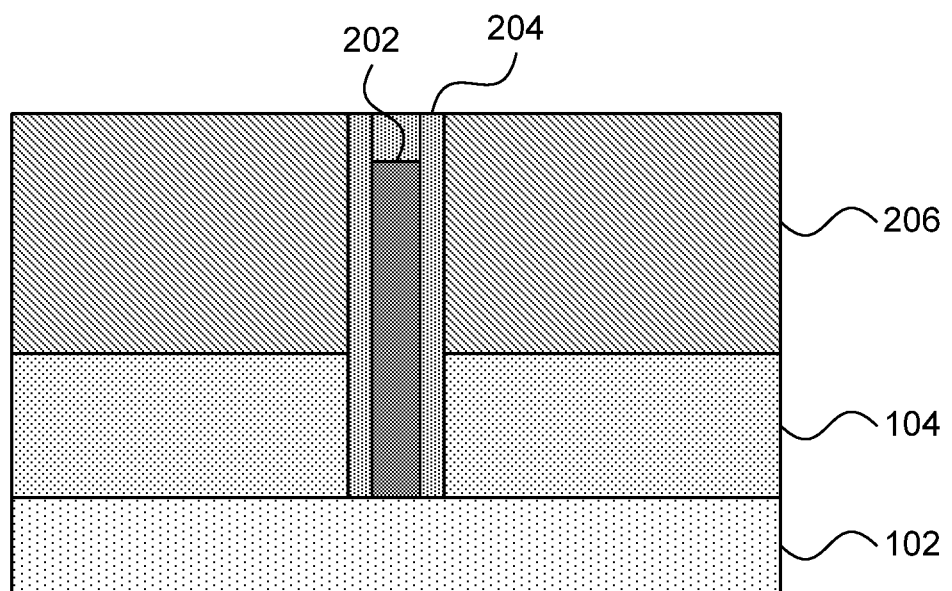
FIG. 2 is a cross-sectional view of a step in the formation of semiconductor devices in accordance with the present principles.

Referring now to FIG. 2, a cross-sectional view of a step in the formation of a semiconductor device is shown along cut A. The dummy gate structure 106 is shown in additional detail as including a dummy gate 202 and a dummy gate hardmask 204 that includes a top portion and sidewalls. It is specifically contemplated that the dummy gate 202 may be formed from, e.g., polysilicon, but it should be understood that the dummy gate may be formed from any material having strong etch selectivity with the material of the hardmask 204. It should be noted that there are practical limits to the height to which the dummy gate 202 may initially be formed. In particular, tall, thin structures may become malformed, for example due to other processing steps and etches on the chip. However, it is advantageous that the final gate structure be as tall as possible.

It is specifically contemplated that the hardmask 204, in turn, may be formed from silicon nitride. In one embodiment, the hardmask 204 may be formed from two separate structures and/or materials, with vertical sidewalls forming one such structure and a top hardmask forming the second such structure. This detail is omitted in the following discussion, but it should be understood that any of the present embodiments may be formed with a single material hardmask or with hardmasks made of multiple materials.

As used herein, the term "selective" in reference to a material removal process denotes that the rate of material removal for a first material is greater than the rate of removal for at least a second material of the structure to which the material removal process is being applied. The degree of selectivity describes the relative rate of removal, with a higher selectivity corresponding to less of the second material being removed.

A dielectric layer 206 is deposited over the source/drain regions 104. It is specifically contemplated that the dielectric layer 206 may be formed using a flowable chemical vapor deposition (FCVD) process and that the dielectric layer 206 may be formed from silicon dioxide. It should be understood that any appropriate dielectric or insulating material may be used instead of silicon dioxide, though it is specifically contemplated that the material of the dielectric layer 206 may have poor etch selectivity with the material of the hardmask 204. After deposition of the dielectric material, the layer is polished down to the level of the hardmask 204 using, e.g., chemical mechanical planarization.

It should be understood that, although FCVD is specifically contemplated, it should be understood that the dielectric layer 206 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 3:
FIG. 3 is a cross-sectional view of a step in the formation of semiconductor devices in accordance with the present principles.

Referring now to FIG. 3, a cross-sectional view of a step in the formation of a semiconductor device is shown along cut B. The gate 202 is shown unbroken, with a hardmask layer 204 on top. It should be noted that this gate structure will be cut into two or more pieces by the present embodiments, such that multiple devices can be formed.

Figure 4:
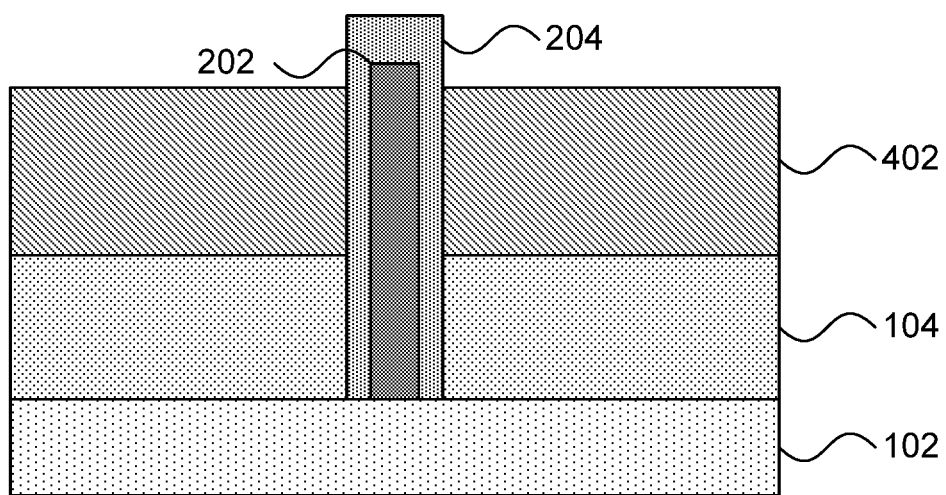
FIG. 4 is a cross-sectional view of a step in the formation of semiconductor devices in accordance with the present principles.

Referring now to FIG. 4, a cross-sectional view of a step in the formation of a semiconductor device is shown along cut A. The dielectric layer 206 is recessed below the height of the hardmask layer 204 using, e.g., a wet or dry chemical etch or any appropriate anisotropic etch, to produce recessed dielectric layer 402.

Figure 5:
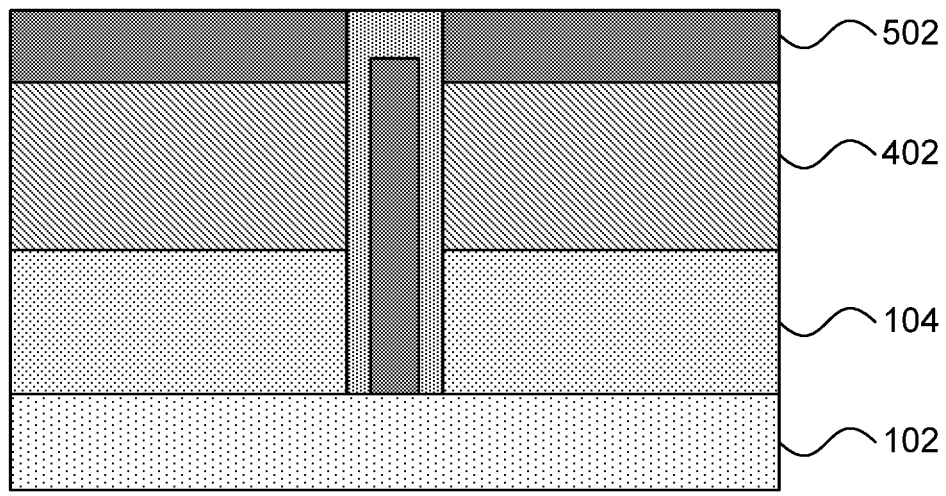
FIG. 5 is a cross-sectional view of a step in the formation of semiconductor devices in accordance with the present principles.

Referring now to FIG. 5, a cross-sectional view of a step in the formation of a semiconductor device is shown along cut A. A protective layer 502 is formed over the recessed dielectric layer 402. It is specifically contemplated that the protective layer 502 may be formed from polysilicon, but it should be understood that other materials may be used instead. In particular, it is contemplated that the material of the protective layer 502 should be oxidizable to form a same material as makes up the recessed dielectric layer 402. The protective layer 502 covers the surface of the recessed dielectric layer 402 to prevent that surface from being damaged by subsequent processes.

Figure 6:
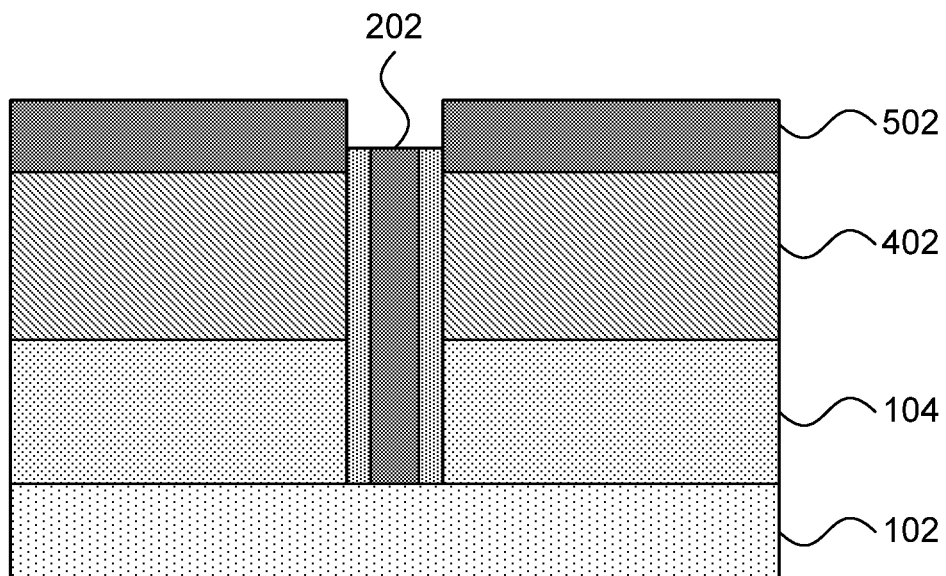
FIG. 6 is a cross-sectional view of a step in the formation of semiconductor devices in accordance with the present principles.

Referring now to FIG. 6, a cross-sectional view of a step in the formation of a semiconductor device is shown along cut A. The nitride hardmask 204 is etched down to expose the dummy gate 202. This etch may be performed with any appropriate isotropic or anisotropic etch that removes material from the hardmask 204 with a high degree of selectivity to the protective layer 502, such that the protective layer 502 is nearly or entirely undamaged by the etch.

Figure 7:
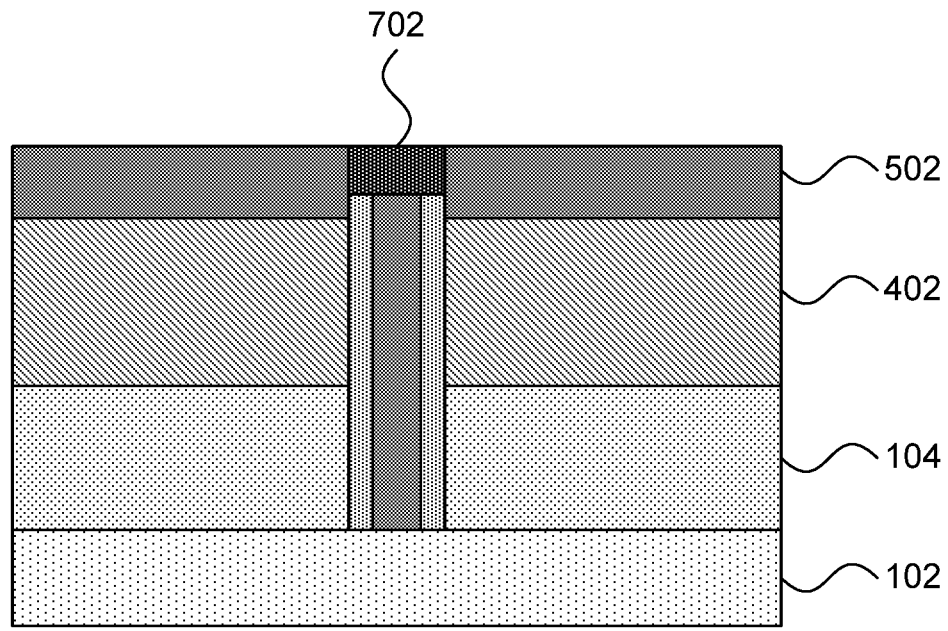
FIG. 7 is a cross-sectional view of a step in the formation of semiconductor devices in accordance with the present principles.

Referring now to FIG. 7, a cross-sectional view of a step in the formation of a semiconductor device is shown along cut A. A sacrificial film 702 is deposited in the gap above the gate 202. It should be understood that the sacrificial film 702 may be any appropriate material that will protect the underlying gate 202 from subsequent processing steps. In one embodiment, the sacrificial film 702 may be formed from, e.g., silicon oxygen carbide or low density (hydrogen-rich) silicon nitride, which is easier to remove than higher density silicon nitride.

Figure 8:
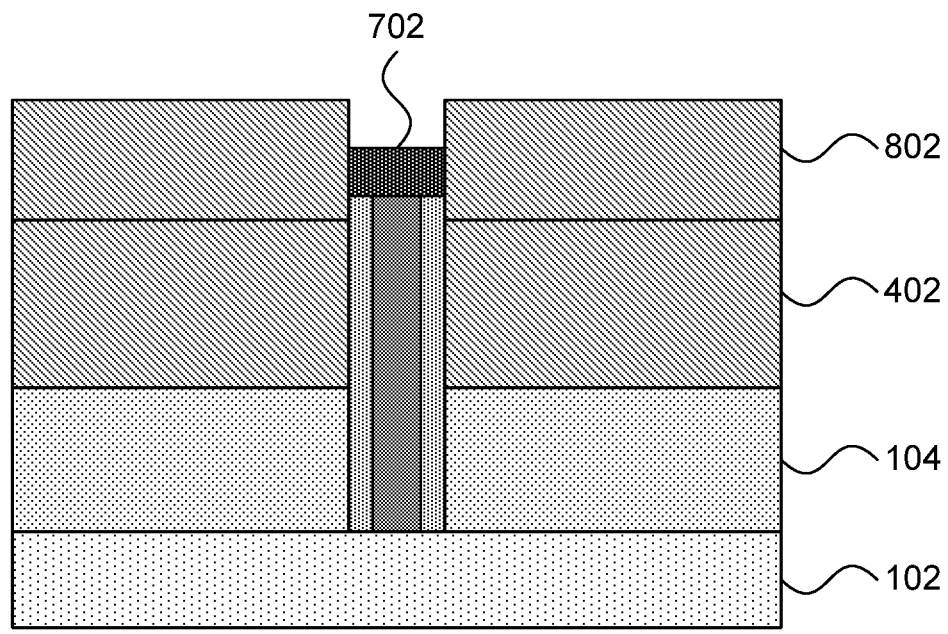
FIG. 8 is a cross-sectional view of a step in the formation of semiconductor devices in accordance with the present principles.

Referring now to FIG. 8, a cross-sectional view of a step in the formation of a semiconductor device is shown along cut A. The protective layer 502 is chemically altered to form a dielectric layer 802. It is specifically contemplated that, in the case where the protective layer 502 is formed from polysilicon, the dielectric layer 802 will be silicon dioxide. The material of the dielectric layer 802 may be the same as the material of the recessed dielectric layer 402 or may be a different material. In one specific embodiment, a wet oxidation at about 400° C. may be used.

One side effect of the conversion of the dielectric layer 802 may be oxidation of the surface of the sacrificial film 702. If so, an isotropic etch may be used to etch back and fully expose the sacrificial film 702. It should also be noted that the oxidation process that turns polysilicon into silicon dioxide will cause the dielectric layer 802 to increase in thickness relative to the original protective layer 502. As a result of this increase in thickness, the gap above the dummy gate 202 also increases, which results in taller gate structures during later gate replacement processes.

Even if both the recessed dielectric layer 402 and the dielectric layer 802 are both formed from silicon dioxide, the internal structures of the respective materials will be different due to their different processes of formation. For example, the recessed dielectric layer 402 may be formed from a FCVD process, which produces a relatively low-quality silicon dioxide structure as compared to a thermal oxidation process which may be used to form the top dielectric layer 802.

Figure 9:
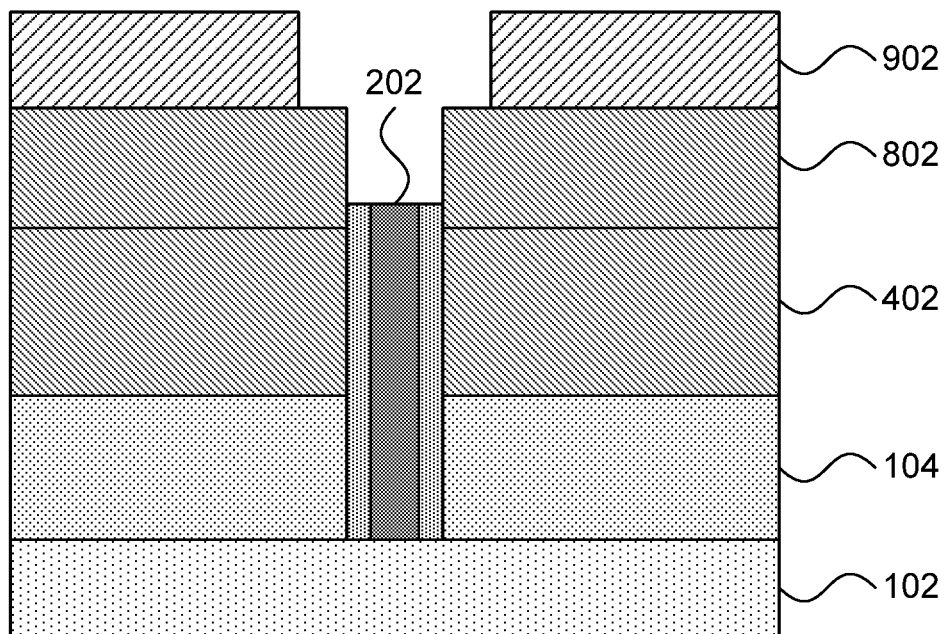
FIG. 9 is a cross-sectional view of a step in the formation of semiconductor devices in accordance with the present principles.

Referring now to FIG. 9, a cross-sectional view of a step in the formation of a semiconductor device is shown along cut A. A gate cut mask 902 is formed over the dielectric layer 802 and the sacrificial liner 702 is removed. The gate mask 902 may be formed by applying a photoresist material to the surface of the dielectric layer 802. The photoresist material is exposed to a pattern of radiation that selectively cures the material, such that uncured material over the gate cut region may be removed. The sacrificial liner 702 can then be removed without harming other structures on the chip.

Figure 10:
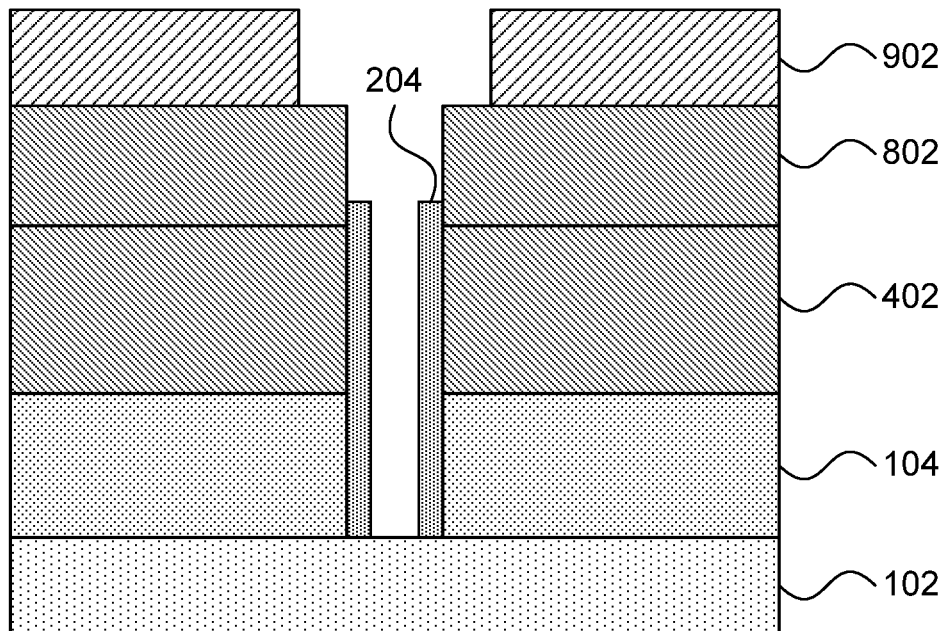
FIG. 10 is a cross-sectional view of a step in the formation of semiconductor devices in accordance with the present principles.

Referring now to FIG. 10, a cross-sectional view of a step in the formation of a semiconductor device is shown along cut A. The dummy gate 202 is etched away, leaving sidewalls 204 defining the gate region. The etch is selective to the dielectric material of the dielectric layer 802.

Figure 11:
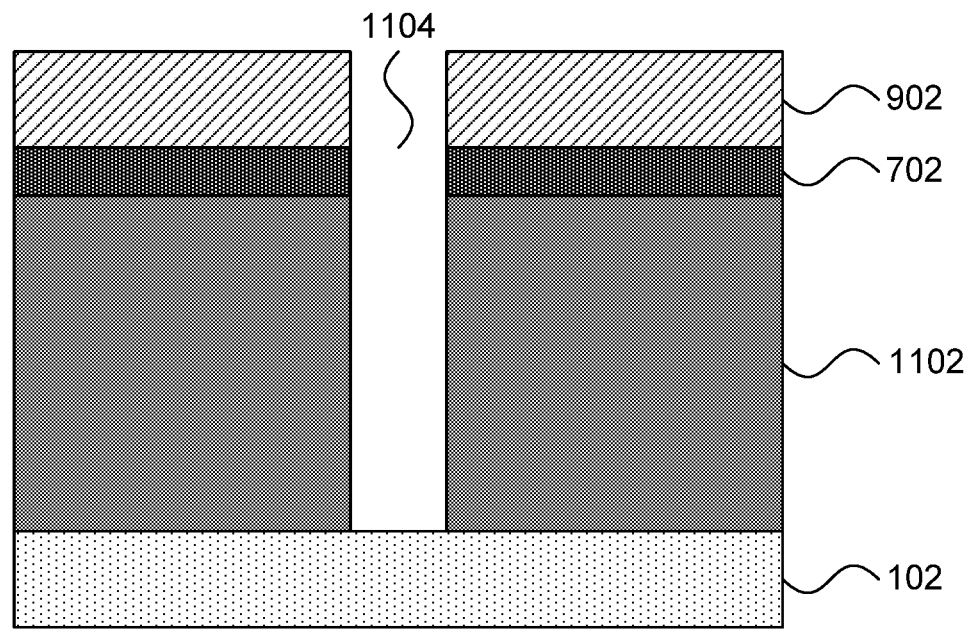
FIG. 11 is a cross-sectional view of a step in the formation of semiconductor devices in accordance with the present principles.

Referring now to FIG. 11, a cross-sectional view of a step in the formation of a semiconductor device is shown along cut B. The gate cut 1104 is shown dividing the dummy gate 202 into sections 1102. The gate cut mask 902 can be formed to create as many cuts as are needed to separate the dummy gate 202 into the appropriate number of sections 1102.

Figure 12:
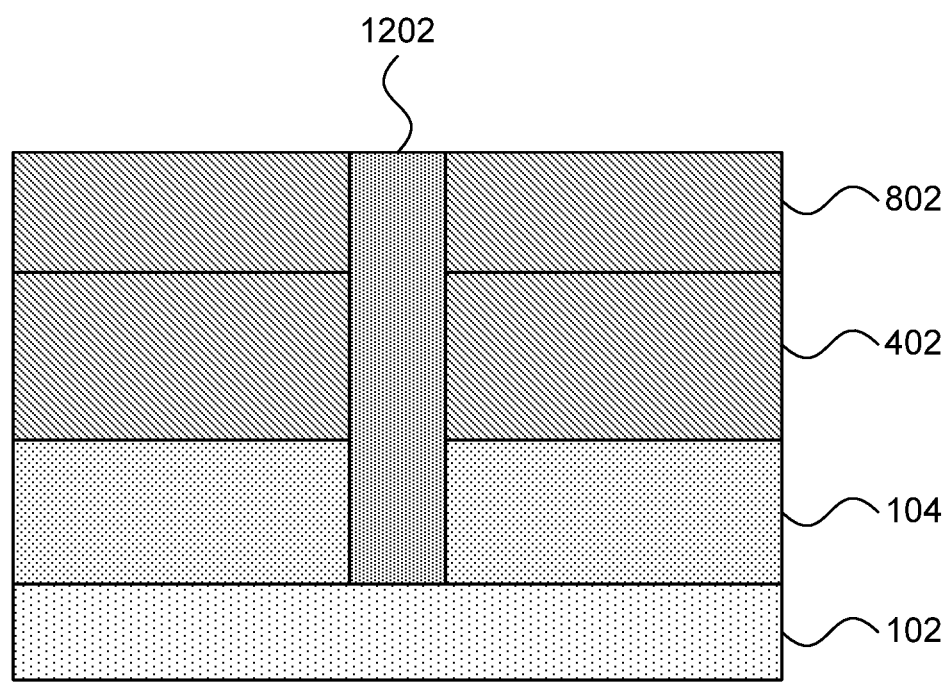
FIG. 12 is a cross-sectional view of a step in the formation of semiconductor devices in accordance with the present principles.

Referring now to FIG. 12, a cross-sectional view of a step in the formation of a semiconductor device is shown along cut A. The dummy gate sections 1102 are etched away and replaced by an appropriate gate structure 1202.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is plot intended to be limiting f example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 13:
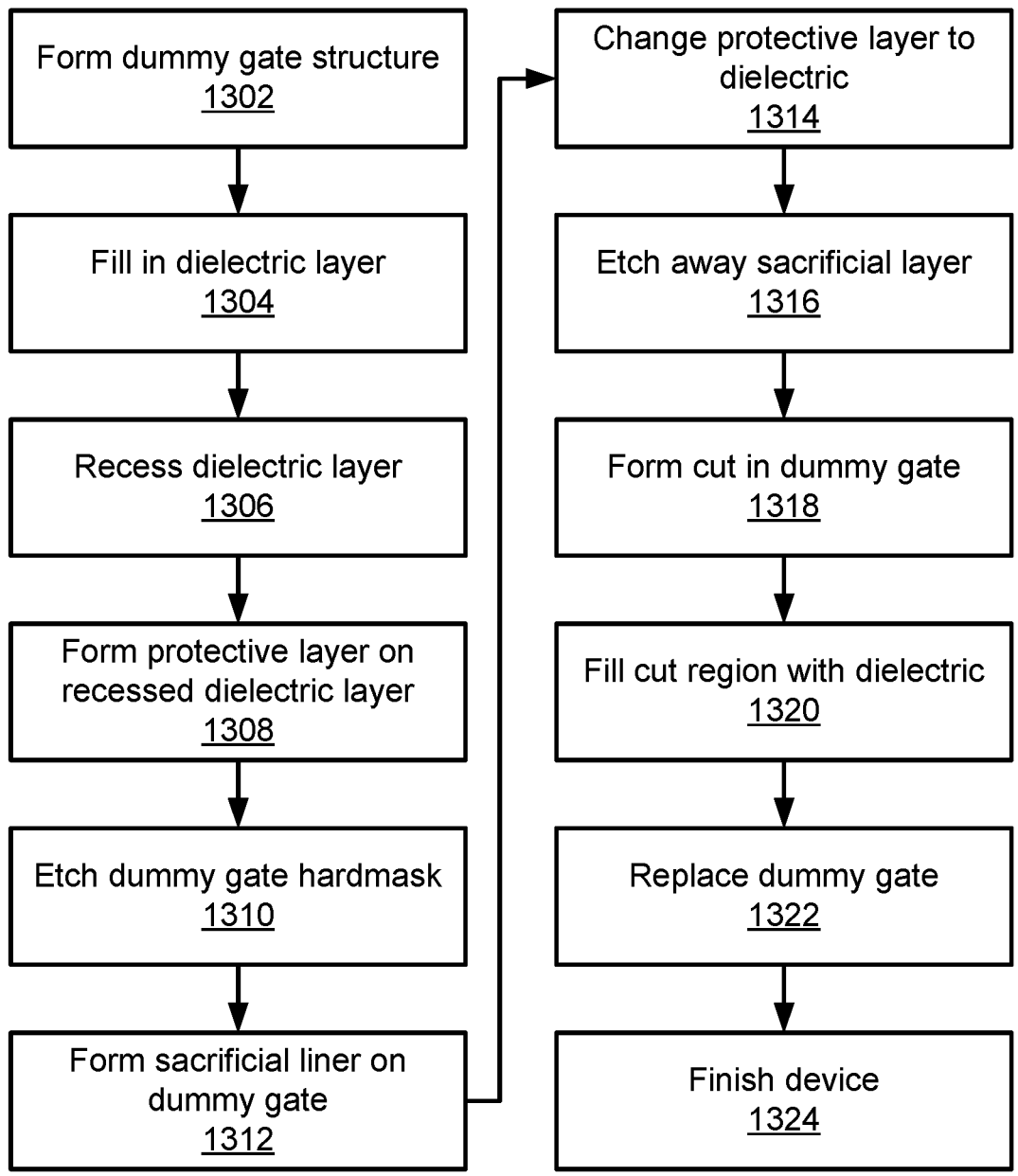
FIG. 13 is a block/flow diagram of a method of forming semiconductor devices in accordance with the present principles.

Referring now to FIG. 13, a method of forming a semiconductor device is shown. Block 1302 forms a dummy gate structure 106 that may include, e.g., a dummy gate 202 and a dummy gate hardmask 204. Block 1304 then fills in dielectric layer 206 to the height of the dummy gate structure 106, for example by depositing a flowable silicon dioxide and then polishing the material down to the level of the dummy gate hardmask 204 using, e.g., CMP. Block 1306 then recesses the dielectric layer 206 below the height of the dummy gate hardmask 204.

Block 1308 forms protective layer 502 on top of the recessed dielectric layer 402, up to the height of the dummy gate hardmask 204. The protective layer 502 may be formed from, e.g., polysilicon and may be deposited by any appropriate deposition process, then polished down. Block 1310 etches the dummy gate hardmask 204 down to at least the height of the dummy gate 202 and block 702 forms a sacrificial liner 702 over the dummy gate 202.

Block 1314 causes a chemical change in the protective layer 502 to transform that layer into a dielectric layer 802. It is specifically contemplated that a thermal oxidation process may be employed to change polysilicon into a high-quality silicon dioxide (contrasted to the lower-quality silicon dioxide of the recessed dielectric layer 402). Block 1316 then etches away the sacrificial liner 702 to expose the dummy gate 202.

Block 1318 forms a cut in the dummy gate 202, separating the dummy gate 202 into multiple sections 1102. Block 1320 fills the cut area with a dielectric material such as, e.g., silicon nitride. Block 1322 then replaces the remaining dummy gate sections 1102 with, e.g., metal gate structures. Block 1324 finishes the devices by forming, e.g., electrical contacts to the gates and to source/drain regions.

Figure 14:
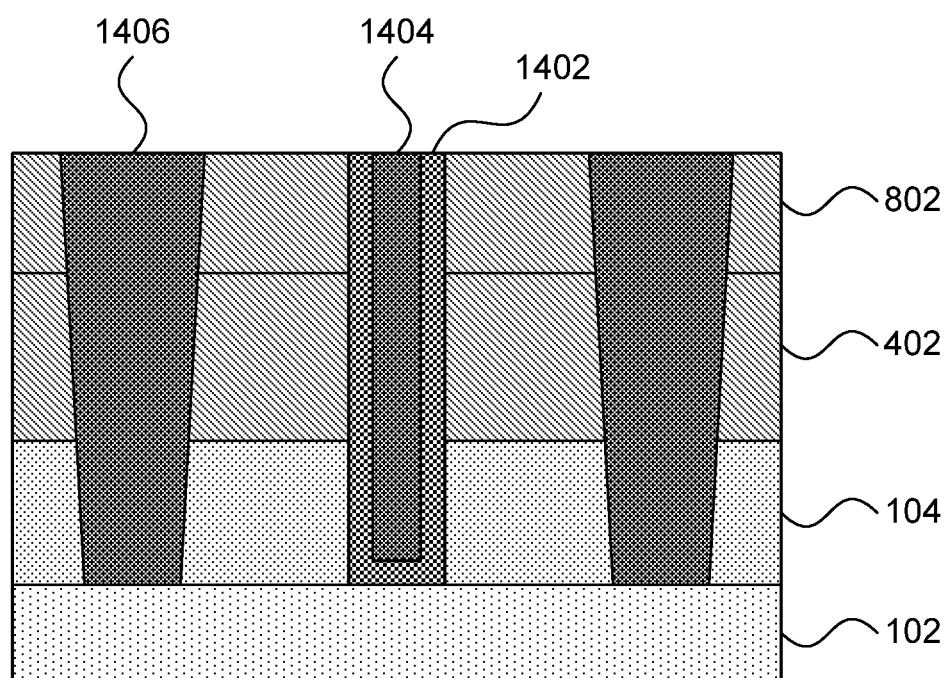
FIG. 14 is a cross-sectional view of a semiconductor device in accordance with the present principles.

Referring now to FIG. 14, a cross-sectional view of a semiconductor device is shown. A gate dielectric 1402 is deposited and a replacement gate 1404 is filled into the gap. The gate dielectric 1402 may be formed from any appropriate dielectric material including, e.g., silicon dioxide or a high-k dielectric such as oxides of tantalum, zirconium, aluminum, or combinations thereof. The replacement gate 1404 may be formed from any appropriate conducting metal such as, e.g., tungsten, nickel, titanium, molybdenum, tantalum, copper, platinum, silver, gold, rubidium, iridium, rhenium, and rhodium. Contacts 1406 are formed that pierce the upper dielectric layer 802 and the recessed dielectric layer 402 to contact the source/drain regions.

It should be noted that the finished device does not suffer from recesses in the surface of the top dielectric layer 802 that would otherwise result from the etch in block 1310. In addition, a top portion of the replacement gate structure will be significantly taller than would have been possible otherwise, due first to the lack of etching of the top dielectric layer and second to the increase in thickness that results from oxidizing polysilicon to form silicon dioxide. This increased height provides superior device characteristics, but does not suffer from the low yield that might result from forming the initial dummy gate 202 to the desired final gate height.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming semiconductor devices comprising:
   forming a lower dielectric layer to a height below a height of a dummy gate hardmask disposed across multiple device regions by forming a dielectric fill to a height of a dummy gate and etching the dielectric fill back, wherein a dummy gate structure includes the dummy gate and the dummy gate hardmask;
   forming a protective layer on the dielectric layer to the height of the dummy gate hardmask; and
   etching back the dummy gate hardmask to expose the dummy gate.

2. The method of claim 1, further comprising converting the protective layer to an upper dielectric layer.

3. The method of claim 2, wherein a thickness of the upper dielectric layer is greater than a thickness of the protective layer.

4. The method of claim 1, wherein converting the protective layer comprises oxidizing the protective layer.

5. The method of claim 4, further comprising forming a sacrificial liner over the dummy gate after the dummy gate hardmask is etched back to protect the dummy gate from the conversion of the protective layer.

6. The method of claim 5, further comprising etching away the sacrificial liner after converting the protective layer.

7. The method of claim 1, further comprising:
removing the dummy gate in one or more barrier regions; and
forming a dielectric barrier in the one or more barrier regions.

8. A method of forming semiconductor devices comprising:
forming a lower dielectric layer to a height below a height of a dummy gate hardmask disposed across multiple device regions, wherein a dummy gate structure includes a dummy gate and the dummy gate hardmask;
forming a protective layer on the dielectric layer to the height of the dummy gate hardmask;
etching back the dummy gate hardmask to expose the dummy gate; and
converting the protective layer to an upper dielectric layer.

9. The method of claim 8, wherein forming the lower dielectric layer comprises forming a dielectric fill to the height of the dummy gate hardmask and etching the dielectric fill back.

10. The method of claim 9, wherein a thickness of the upper dielectric layer is greater than a thickness of the protective layer.

11. The method of claim 10, wherein converting the protective layer comprises oxidizing the protective layer.

12. The method of claim 10, further comprising forming a sacrificial liner over the dummy gate after the dummy gate hardmask is etched back to protect the dummy gate from the conversion of the protective layer.

13. The method of claim 12, further comprising etching away the sacrificial liner after converting the protective layer.

14. A method of forming semiconductor devices comprising:
forming a lower dielectric layer to a height below a height of a dummy gate hardmask disposed across multiple device regions, wherein a dummy gate structure includes a dummy gate and the dummy gate hardmask;
forming a protective layer on the dielectric layer, to the height of the dummy gate hardmask;
etching back the dummy gate hardmask to expose the dummy gate;
removing the dummy gate in one or more barrier regions; and
forming a dielectric barrier in the one or more barrier regions.

15. The method of claim 14, wherein forming the lower dielectric layer comprises forming a dielectric fill to the height of the dummy gate hardmask and etching the dielectric fill back.

16. The method of claim 14, further comprising forming a sacrificial liner over the dummy gate after the dummy gate hardmask is etched back to protect the dummy gate from the conversion of the protective layer.

* * * * *